United States Patent
Yeh et al.

(10) Patent No.: US 7,231,309 B2
(45) Date of Patent: Jun. 12, 2007

(54) METHOD AND APPARATUS FOR TESTING A BRIDGE CIRCUIT

(75) Inventors: Biyun Yeh, Taipei Hsien (TW); Victor Wu, Taipei Hsien (TW); Jiin Lai, Taipei Hsien (TW)

(73) Assignee: VIA Technologies Inc., Hsin-Tien, Taipei Hsien (TW)

( * ) Notice: Subject to any disclaimer, the term of this patent is extended or adjusted under 35 U.S.C. 154(b) by 0 days.

(21) Appl. No.: 10/904,047

(22) Filed: Oct. 21, 2004

(65) Prior Publication Data

US 2005/0086019 A1   Apr. 21, 2005

Related U.S. Application Data

(60) Provisional application No. 60/481,537, filed on Oct. 21, 2003.

(51) Int. Cl.
  *G06F 19/00* (2006.01)
(52) U.S. Cl. .................. 702/117; 702/118; 324/526; 324/648; 324/725; 324/76.61; 710/306; 710/315
(58) Field of Classification Search ........ 702/117–118; 324/526, 610, 648, 680, 725, 765, 101, 120, 324/76.61; 710/306, 315
See application file for complete search history.

(56) References Cited

U.S. PATENT DOCUMENTS

| | | | |
|---|---|---|---|
| 6,247,102 B1* | 6/2001 | Chin et al. ................. | 711/150 |
| 6,263,389 B1* | 7/2001 | LaBerge ..................... | 710/306 |
| 6,338,143 B1* | 1/2002 | Shimazaki .................. | 713/340 |
| 2005/0086019 A1 | 4/2005 | Yeh et al. | |

FOREIGN PATENT DOCUMENTS

TW     347939     12/1998

* cited by examiner

*Primary Examiner*—Marc S. Hoff
*Assistant Examiner*—Elias Desta
(74) *Attorney, Agent, or Firm*—Winston Hsu

(57) ABSTRACT

A method and an apparatus for testing a bridge circuit. The method includes inputting a first test clock to a first conversion unit for triggering the first conversion unit to transfer a test data to a second conversion unit according to rising edges of the first test clock, inputting a second test clock to the second conversion unit for triggering the second conversion unit to output an output data according to falling edges of the second test clock, and controlling the first test clock and the second test clock so that the rising edges of the second test clock are not synchronized to the rising edges of the first test clock. A frequency of the first test clock is an even multiple of a frequency of the second test clock.

18 Claims, 4 Drawing Sheets

METHOD AND APPARATUS FOR TESTING A BRIDGE CIRCUIT

CROSS REFERENCE TO RELATED APPLICATIONS

This application claims the benefit of U.S. Provisional Application No. 60/481,537, which was filed on Oct. 21, 2003 and entitled "Asynchronous Speed Vector Test".

BACKGROUND OF INVENTION

1. Field of the Invention

The present invention relates to an apparatus for testing integrated circuits and a method thereof, and more specifically, to an apparatus for testing a bridge circuit and a method thereof.

2. Description of the Prior Art

Computers are widely used in all kinds of fields, and as the fabrication of semiconductors advances, CPU speeds are rapidly increasing. Besides the CPU, there are many other devices necessary for a computer to do various tasks. For example, a memory is used to store volatile data, a hard disk is used to store nonvolatile data, and a video card is used to drive display devices. In addition, there are also buses through which different devices in a computer can communicate. For example, a hard disk transmits/receives data to/from other devices in a computer via a PCI bus, a memory via a memory bus, a video card via an AGP bus, and a CPU via an FSB bus.

Different buses usually utilize different specifications, which are well known in the industry. Generally, different buses utilize different clock speeds, for example, in the prior art, the clock speed of a PCI bus is 33 MHz, that of an AGP bus is 66 MHz, that of a memory bus is 133 or 200 MHz, and that of a FSB bus is 266, 400, or 800 MHz. To communicate between different buses having different clock speeds, a bridge circuit (such as a "south bridge circuit" or a "north bridge circuit" in commonly used terminology) is needed. A bridge circuit is used to transfer data from one clock domain to another clock domain.

When a die is packaged (for example, a BGA package), the die must be tested according to a test vector to verify its function. However, since a bridge circuit is used to transfer data between different clock domains, a bridge circuit may be failed during testing due to the problem caused by different clock domains. This means that the result of the test procedure may be incorrect.

FIG. 1 is a timing diagram of a prior art bridge circuit. The drawing shows an example circuit in which a bridge circuit is used to transfer data from a higher clock domain ($CLK_1$, 200 MHz, for example, a CPU controller) to a lower clock domain ($CLK_2$, 133 MHz, for example, an AGP controller), and the ratio of $CLK_1$ to $CLK_2$ is 3:2. A prior art bridge circuit uses a flip-flop to store and output data. For example, the rising edge of $CLK_1$ triggers a first flip-flop to sample the test data inputted by the CPU controller, and transfers the data to a second flip-flop; meanwhile, the falling edge of $CLK_2$ triggers the second flip-flop to sample the test data outputted by the first flip-flop, which then outputs the test data.

A typical prior art test procedure utilizes the actual operation clocks (in this case, $CLK_1$ and $CLK_2$) of a bridge circuit to test it. In FIG. 1, at time T1, $CLK_1$ generates a rising edge so that the first flip-flop of the bridge circuit samples the test data from the CPU controller. Then, at time T3, $CLK_2$ generates a falling edge so that the second flip-flop of the bridge circuit samples the test data from the first flip-flop and then outputs the data. Please note that at time T5, $CLK_1$ generates a rising edge so that the first flip-flop of the bridge circuit samples the test data from the CPU controller; however, next, at time T6 there is a falling edge of $CLK_2$. The time interval between T5 and T6 may be too short for the first flip-flop to provide the second flip-flop with enough setup time. This means that the bridge circuit may not receive the correct test data in time, causing the test procedure to fail. Although during the test procedure the bridge circuit fails to transfer data from one clock domain to another clock domain at time T6, when the bridge circuit is in practical operation, the missed data will be re-transferred by the bridge circuit to complete the transmission. In short, even if a bridge circuit works normally in practical operation, it may fail the test procedure due to the problems caused by different clock domains.

The problem mentioned above also occurs when a bridge circuit transfers data from a lower clock domain ($CLK_2$, 133 MHz, for example, an AGP controller) to a higher clock domain ($CLK_1$, 200 MHz, for example, a CPU controller). In this case, the rising edge of $CLK_2$ triggers a first flip-flop to sample the test data inputted by the AGP controller, and transfer the data to a second flip-flop; meanwhile, the falling edge of $CLK_1$ triggers the second flip-flop to sample the test data outputted by the first flip-flop, and then output the test data to the CPU controller.

Please refer to FIG. 1. At time T1, $CLK_2$ generates a rising edge so that the first flip-flop of the bridge circuit samples the test data from the AGP controller. Then, at time T2, $CLK_1$ generates a falling edge so that the second flip-flop of the bridge circuit samples the test data stored in the first flip-flop and then outputs the test data. Please note that at time T4, when $CLK_1$ and $CLK_2$ respectively generate a falling edge and a rising edge at the same time, the second flip-flop may not be able to sample the test data successfully, and therefore, the test procedure may fail. Similarly, although during the test procedure the bridge circuit fails to transfer data from one clock domain to another clock domain at time T4, when the bridge circuit is in practical operation, the missed data will be re-transferred by the bridge circuit to complete the transmission. In short, even if a bridge circuit works normally in practical operation, it may still be failed during the test procedure due to the problems caused by different clock domains.

SUMMARY OF INVENTION

The present invention provides an apparatus for testing a bridge circuit and the method thereof.

A method for testing a bridge circuit is provided. The bridge circuit transfers data from a first clock domain to a second clock domain, and the bridge circuit comprises a first conversion unit corresponding to the first clock domain and a second conversion unit corresponding to the second clock domain. The method includes the steps of: inputting a first test clock to the first conversion unit for triggering the first conversion unit to transfer a test data to the second conversion unit according to a first edge of the first test clock, and inputting a second test clock to the second conversion unit for triggering the second conversion unit to output an output data according to a second edge of the second test clock, wherein a frequency of the first test clock is an even multiple of a frequency of the second test clock; and controlling the first edge of the second test clock to be asynchronous to the first edge of the first test clock.

A test system is provided. The system includes a bridge circuit for transferring data from a first clock domain to a second clock domain, and a test circuit electrically connected to the bridge circuit for testing the bridge circuit. The bridge circuit includes a first conversion unit corresponding to the first clock domain; and a second conversion unit electrically connected to the first conversion unit and corresponding to the second clock domain. The test circuit includes a first clock-generating module for inputting a first test clock to the first conversion unit for triggering the first conversion unit to transfer test data to the second conversion unit according to a first edge of the first test clock; a second clock-generating module for inputting a second test clock to the second conversion unit for triggering the second conversion unit to output an output data according to a second edge of the second test clock, wherein a frequency of the first test clock is an even multiple of a frequency of the second test clock; and a control module electrically connected to the first clock-generating module and the second clock-generating module for controlling the first edge of the second test clock to be asynchronous to the first edge of the first test clock.

The test system of the present invention utilizes frequencies in an even-multiple relationship to test a bridge circuit and also controls the rising edge of the lower speed clock to be synchronous to the falling edge of the higher speed clock. By doing this, the problems caused by different clock domains during the test can be solved.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
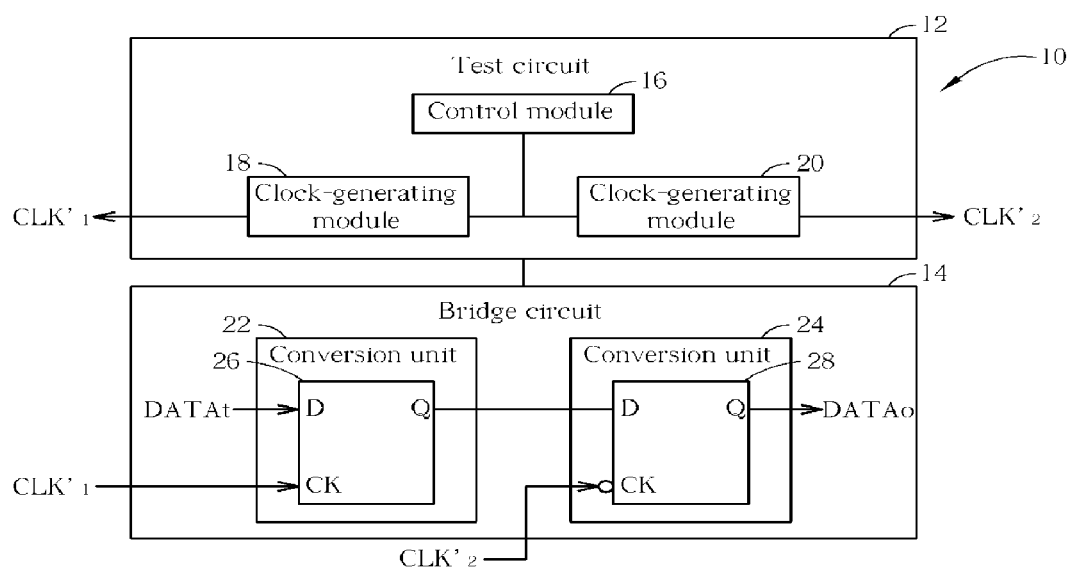
FIG. 2 is a diagram of a first test system of the present invention.

FIG. 2 is a diagram of the first test system 10 of the present invention. The first test system 10 contains a test circuit 12, for example, a test apparatus, and a bridge circuit 14. In this embodiment, the test circuit 12 contains a control module 16, and two clock-generating modules 18 and 20. The bridge circuit 14 contains two conversion units 22 and 24. The control module 16 controls the two clock-generating modules 18 and 20, which generate two test clocks $CLK'_1$ and $CLK'_2$ with different frequencies. The frequency of $CLK'_1$ is an even multiple of the frequency of $CLK'_2$. For example, if the bridge circuit 14 is used to transfer the data from the CPU controller with a 200 MHz clock to the PCI bus with a 66 MHz clock, when the bridge circuit 14 is being tested, the ratio of $CLK'_1$ to $CLK'_2$ is respectively set to be 4:1 and then 1:1, for example, 200 MHz to 50 MHz and 66 MHz to 66 MHz, respectively. It is suggested that the test frequency is chosen to be smaller or equal to the maximum original frequency.

In addition, the control module 16 controls the two clock-generating modules 18 and 20 to make the rising edges of $CLK'_1$ and the rising edges of $CLK'_2$ be asynchronous. The purpose of this action will be discussed below.

Figure 1:
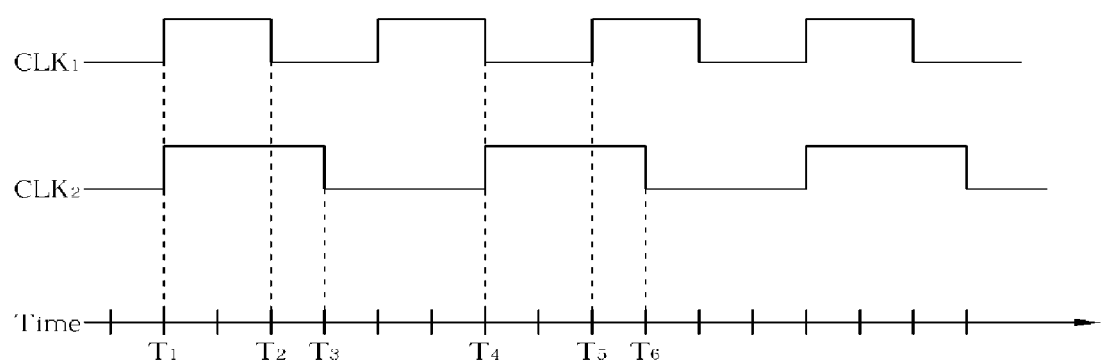
FIG. 1 is a timing diagram of a prior art bridge circuit.

The conversion unit 22 contains a flip-flop 26 which is a rising-edge-triggered circuit. The clock terminal CK of the flip-flop 26 receives the test clock $CLK'_1$ as its input, and the data terminal D receives test data $DATA_t$ as its input. In the same way, the conversion unit 24 contains a flip-flop 28 which is a falling-edge-triggered circuit. The clock terminal CK of the flip-flop 28 receives the test clock $CLK'_2$ as its input, and the data terminal D is electrically connected to the output terminal Q of the flip-flop 26 through which the output data $DATA_o$ is outputted. The conversion units 22 and 24 are in different clock domains, i.e., the conversion unit 22 is driven by $CLK'_1$, and the conversion unit 24 is driven by $CLK'_2$. Please note that the data terminal D of the flip-flop 26 corresponds to ONE input of the bridge circuit 14, that is, if the bridge circuit 14 contains a plurality of inputs, there must be as many pairs of corresponding flip-flops as the inputs of the bridge circuit 14. However, for simplicity, only one pair of flip-flops, 26 and 28, is shown in FIG. 1. During testing, the test circuit 12 drives the bridge circuit 14 to transfer the test data $DATA_t$ according to a test vector.

Figure 3:
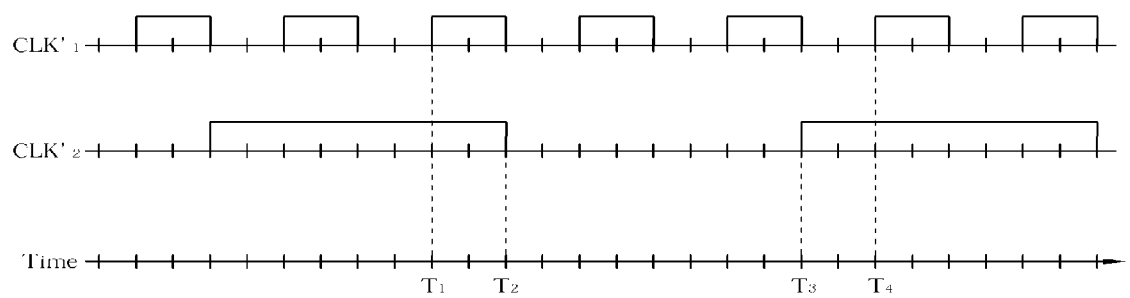
FIG. 3 is a timing diagram of the first test system shown in FIG. 2.

FIG. 3 is a timing diagram of $CLK'_1$ and $CLK'_2$ in FIG. 2. As mentioned above, the frequency ratio of $CLK'_1$ to $CLK'_2$ is 4:1, and the rising edge of $CLK'_2$ is synchronous to the falling edge of $CLK'_1$ due to the control of the control module 16 over the clock-generating modules 18 and 20. At time T1 when $CLK'_1$ generates a rising edge, the flip-flop 26 is triggered to sample the test data $DATA_t$, and then outputs the $DATA_t$ via the output terminal Q. Next at time T2 when $CLK'_2$ generates a falling edge, the flip-flop 28 is triggered to sample the $DATA_t$ from the output terminal Q of flip-flop 26, and then outputs the output data $DATA_o$. In this embodiment, the time interval between T1 and T2 is equal to half the period of $CLK'_1$, and therefore the flip-flop 26 has the maximum marginal time to transfer data from its output terminal Q to the input terminal D of the flip-flop 28 by the time the flip-flop 28 is triggered at time T2. That is, the flip-flop 28 can sample correctly and hence the output data $DATA_o$ will be identical to $DATA_t$. As a result, by proper operation of the conversion units 22 and 24, the bridge circuit 14 can pass the test. In this embodiment, because the frequencies of $CLK'_1$ and $CLK'_2$ are properly set and the rising edge of $CLK'_1$ is set to be synchronous to the falling edge of $CLK'_2$, the problems due to different clock domains can be solved so that the probability of testing error can be greatly decreased.

Figure 4:
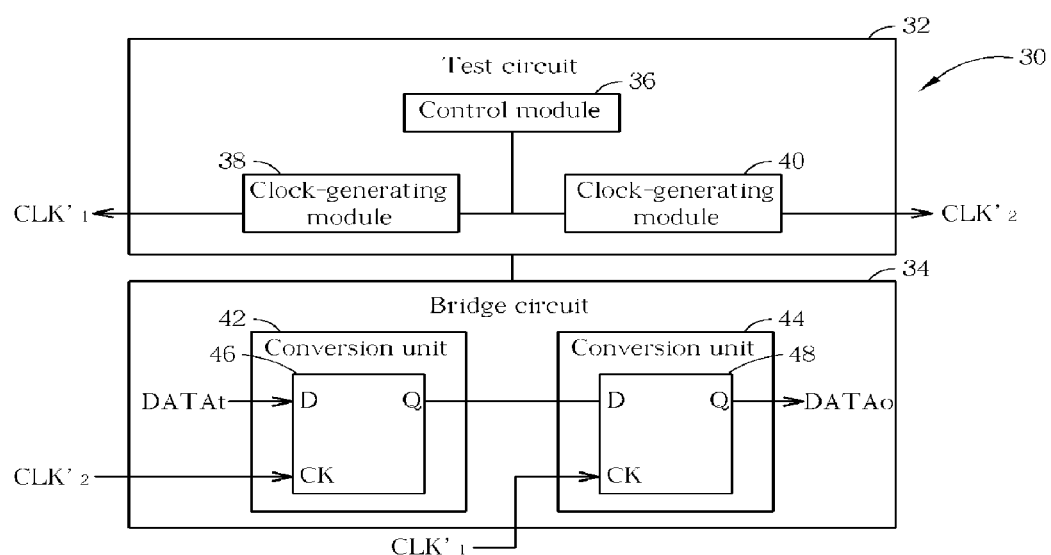
FIG. 4 is a diagram of a second test system of the present invention.

FIG. 4 is a diagram of the second test system 30 of the present invention. The test system 30 contains a test circuit 32, for example, a test apparatus, and a bridge circuit 34. In this embodiment, the test circuit 32 contains a control module 36 and two clock-generating modules 38 and 40, and the bridge circuit 34 contains two conversion units 42 and 44, each of which contains a flip-flop 46 and 48, respectively. Each device of the test system 30 in FIG. 4 has the same function of the corresponding device of the test system 10 in FIG. 2. However, the major difference between these two systems is that the flip-flops 46 and 48 are both rising-edge-triggered circuits, and the flip-flop 46 is triggered by $CLK'_2$ of the clock-generating module 40, and the flip-flop 48 is triggered by $CLK'_1$ of the clock-generating module 38. In the same way as the test system 10 of FIG. 2, the control module 36 of FIG. 4 controls the two clock-generating modules 38 and 40 to make the rising edges of $CLK'_1$ and $CLK'_2$ be asynchronous.

The bridge circuit 14 in FIG. 2 transfers data from one bus with a higher clock speed (for example, the CPU controller)

to another bus with a lower clock speed (for example, the AGP controller); however, the bridge circuit 34 in FIG. 4 transfers data from one bus with a lower clock speed (for example, the AGP controller) to another bus with a higher clock speed (for example, the CPU controller). Because the test system 30 is also controlled by CLK'$_1$ and CLK'$_2$, FIG. 3 is used again to illustrate the test system 30.

In FIG. 3 as mentioned above, the frequency ratio of CLK'$_1$ to CLK'$_2$ is 4:1, and the rising edge of CLK'$_2$ is synchronous to the falling edge of CLK'$_1$ due to the control of the control module 36 over the clock-generating modules 38 and 40. At time T3 when CLK'$_2$ generates a rising edge, the flip-flop 46 is triggered to sample the test data DATA$_t$, and then outputs DATA$_t$ via the output terminal Q. Next, at time T4 when CLK'$_1$ generates a rising edge, the flip-flop 48 is triggered to sample DATA$_t$ from the output terminal Q of flip-flop 46, and then outputs the output data DATA$_o$. In this embodiment, the time interval between T3 and T4 is equal to half the period of CLK'$_1$, and therefore the flip-flop 46 has the maximum margin time to transfer data from the its output terminal Q to the input terminal D of the flip-flop 48 by the time the flip-flop 48 is triggered at time T4. That is, the flip-flop 48 can sample correctly and hence the output data DATA$_o$ will be identical to DATA$_t$. As a result, by proper operation of the conversion units 42 and 44, the bridge circuit 34 can pass the test. In this embodiment, because the frequencies of CLK'$_1$ and CLK'$_2$ are properly set and the rising edge of CLK'$_2$ is set to be synchronous to the falling edge of CLK'$_1$, the problem due to different clock domains can be solved so that the probability of testing error is greatly decreased.

In comparison with the prior art, the test system of the present invention does not utilize the actual operation clocks to test the bridge circuit because when the test system utilizes the actual operation clocks of a bridge circuit, there may be problems during the test if the frequency of one clock is not an even multiple of that of the other. As a result, the test system of the present invention utilizes frequencies in an even-multiple relationship to test a bridge circuit and also controls the rising edge of the lower clock to be synchronous to the falling edge of the higher clock. By doing this, the problems caused by different clock domains during testing can be solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for testing a bridge circuit, the bridge circuit being used for transferring data from a first clock domain to a second clock domain, the bridge circuit comprising a first conversion unit corresponding to the first clock domain and a second conversion unit corresponding to the second clock domain, the method comprising the steps of:
   inputting a first test clock to the first conversion unit for triggering the first conversion unit to transfer a test data to the second conversion unit according to a rising edge of the first test clock, and inputting a second test clock to the second conversion unit for triggering the second conversion unit to output an output data according to a falling edge of the second test clock; and
   controlling the rising edge of the second test clock to be asynchronous to the rising edge of the first test clock.

2. The method of claim 1, further comprising controlling the rising edge of the first test clock to he synchronous to the falling edge of the second test clock.

3. The method of claim 1, wherein the first clock domain corresponds to a CPU controller, and the second clock domain corresponds to a PCI bus.

4. The method of claim 1, wherein the first clock domain corresponds to a memory bus, and the second clock domain corresponds to an AGP controller.

5. A method for testing a bridge circuit, the bridge circuit being used for transferring data from a first clock domain to a second clock domain, the bridge circuit comprising a first conversion unit corresponding to the first clock domain and a second conversion unit corresponding to the second clock domain, the method comprising:
   inputting a first test clock to the first conversion unit for triggering the first conversion unit to transfer a test data to the second conversion unit according to a first edge of the first test clock, and inputting a second test clock to the second conversion unit for trigger the second conversion unit to output an output data according to a first edge of the second test clock, wherein a frequency of the second test clock is evenly divisible by a frequency of the first test clock, and the frequency of the second test clock is greater than the frequency of the first test clock by a factor that is a multiple of two; and
   controlling the first edge of the second test clock to be asynchronous to the first edge of the first test clock.

6. The method of claim 5, further comprising controlling the first edge of the first test clock to be synchronous to the second edge of the second test clock.

7. The method of claim 6, wherein the first edge is a rising edge, and the second edge is a falling edge.

8. The method of claim 5, wherein the second clock domain corresponds to a CPU controller, and the first clock domain corresponds to a PCI bus.

9. The method of claim 5, wherein the second clock domain corresponds to a memory bus, and the first clock domain corresponds to an AGP controller.

10. A test system comprising:
   a bridge circuit for transferring data from a first clock domain to a second clock domain, comprising:
      a first conversion unit corresponding to the first clock domain; and
      a second conversion unit electrically connected to the first conversion unit and corresponding to the second clock domain; and
   a test circuit electrically connected to the bridge circuit for testing the bridge circuit, comprising:
      a first clock-generating module for inputting a first test clock to the first conversion unit for triggering the first conversion unit to transfer a test data to the second conversion unit according to a rising edge of the first test clock;
      a second clock-generating module for inputting a second test clock to the second conversion unit for triggering the second conversion unit to output an output data according to a falling edge of the second test clock, wherein a frequency of the first test clock is evenly divisible by a frequency of the second test clock, and the frequency of the second test clock is greater than the frequency of the first test clock by a factor that is a multiple of two; and
      a control module electrically connected to the first clock-generating module and the second clock-generating module, for controlling the rising edge of the second test clock to be asynchronous to the rising edge of the first test clock.

11. The test system of claim 10, wherein the test circuit controls the rising edge of the first test clock to be synchronous to the falling edge of the second test clock.

12. The test system of claim 10, wherein the first clock domain corresponds to a CPU controller, and the second clock domain corresponds to a PCI bus.

13. The test system of claim 10, wherein the first clock domain corresponds to a memory bus, and the second clock domain corresponds to an AGP controller.

14. A test system comprising:
a bridge circuit for transferring data from a first clock domain to a second clock domain, comprising:
  a first conversion unit corresponding to the first clock domain; and
  a second conversion unit electrically connected to the first conversion unit and corresponding to the second clock domain; and
a test circuit electrically connected to the bridge circuit for testing the bridge circuit, comprising:
  a first clock-generating module for inputting a first test clock to the first conversion unit for triggering the first conversion unit to transfer a test data to the second conversion unit according to a first edge of the first test clock;
  a second clock-generating module for inputting a second test clock to the second conversion unit for triggering the second conversion unit to output an output data according to a first edge of the second test clock, wherein a frequency of the second test clock is evenly divisible by a frequency of the first test clock, and the frequency of the second test clock is greater than the frequency of the first test clock by a factor that is a multiple of two; and
  a control module electrically connected to the first clock-generating module and the second clock-generating module, for controlling the first edge of the second test clock to be asynchronous to the first edge of the first test clock.

15. The test system of claim 14, wherein the test circuit controls the first edge of the first test clock to be synchronous to the second edge of the second test clock.

16. The test system of claim 15, wherein the first edge is a rising edge, and the second edge is a falling edge.

17. The test system of claim 14, wherein the second clock domain corresponds to a CPU controller, and the first clock domain corresponds to a PCI bus.

18. The test system of claim 14, wherein the second clock domain corresponds to a memory bus, and the first clock domain corresponds to an AGP controller.

* * * * *